(12) United States Patent  
Nakamura et al.

(10) Patent No.: US 8,643,269 B2
(45) Date of Patent: *Feb. 4, 2014

(54) ORGANIC EL DEVICE AND METHOD FOR MANUFACTURING THE SAME

(71) Applicant: LG Display Co., Ltd., Seoul (KR)

(72) Inventors: Yoshiki Nakamura, Higashiomi (JP); Taro Hasumi, Yamato (JP); Shinji Takasugi, Yamato (JP); Naoyuki Nakanishi, Yasu (JP)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/658,420

(22) Filed: Oct. 23, 2012

(65) Prior Publication Data

US 2013/0043785 A1 Feb. 21, 2013

Related U.S. Application Data

(63) Continuation of application No. 12/514,567, filed as application No. PCT/JP2007/073073 on Nov. 29, 2007, now Pat. No. 8,304,982.

(30) Foreign Application Priority Data

Nov. 30, 2006 (JP) ................................. 2006-323492

(51) Int. Cl.
*H05B 33/04* (2006.01)

(52) U.S. Cl.
USPC ............................ 313/504; 313/505; 313/506

(58) Field of Classification Search
USPC .................... 313/495–512; 315/169.3, 169.4; 257/40, 79; 428/690, 917; 345/30, 36, 345/44

See application file for complete search history.

(56) References Cited

U.S. PATENT DOCUMENTS

| | | | |
|---|---|---|---|
| 6,768,534 | B2 | 7/2004 | Iwase et al. |
| 2003/0071570 | A1 | 4/2003 | Tamashiro et al. |
| 2004/0051452 | A1 | 3/2004 | Tamashiro et al. |
| 2005/0179377 | A1 | 8/2005 | Shitagami et al. |
| 2005/0189878 | A1 | 9/2005 | Shitagami et al. |
| 2005/0236620 | A1 | 10/2005 | Yamada |
| 2005/0236968 | A1 | 10/2005 | Gunner et al. |

FOREIGN PATENT DOCUMENTS

| | | |
|---|---|---|
| JP | 2003-178866 A | 6/2003 |
| JP | 2004-111119 A | 4/2004 |
| JP | 2005-251415 A | 9/2005 |
| JP | 2005-310708 A | 11/2005 |
| JP | 2006-98638 A | 4/2006 |

*Primary Examiner* — Anh Mai
*Assistant Examiner* — Elmito Breval
(74) *Attorney, Agent, or Firm* — Birch, Stewart, Kolasch & Birch, LLP

(57) ABSTRACT

A sealing layer covers more surely both of a display region and a peripheral region on a substrate. A dummy structure is formed in the peripheral region of the substrate. The dummy structure contains, for instance, at least one of the materials constituting an organic EL display structure. The dummy structure is located in the peripheral region so that the volume per unit area of the sealing layer in the peripheral region is substantially the same as that in the display region.

10 Claims, 5 Drawing Sheets

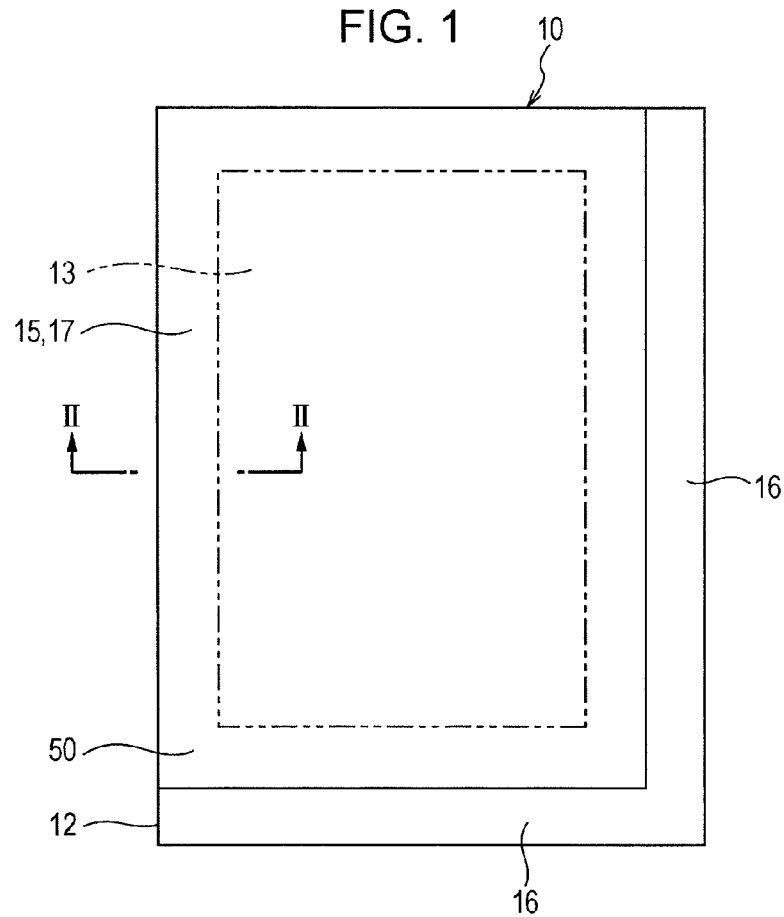
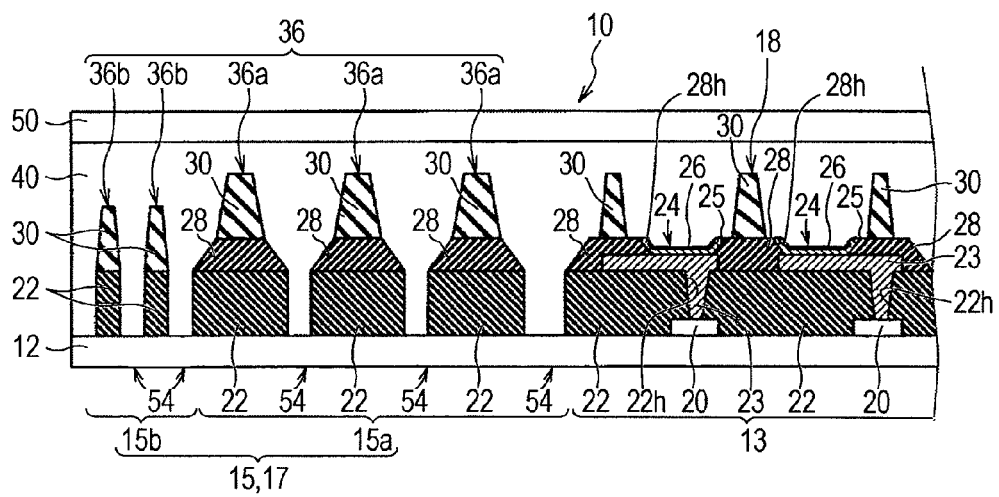

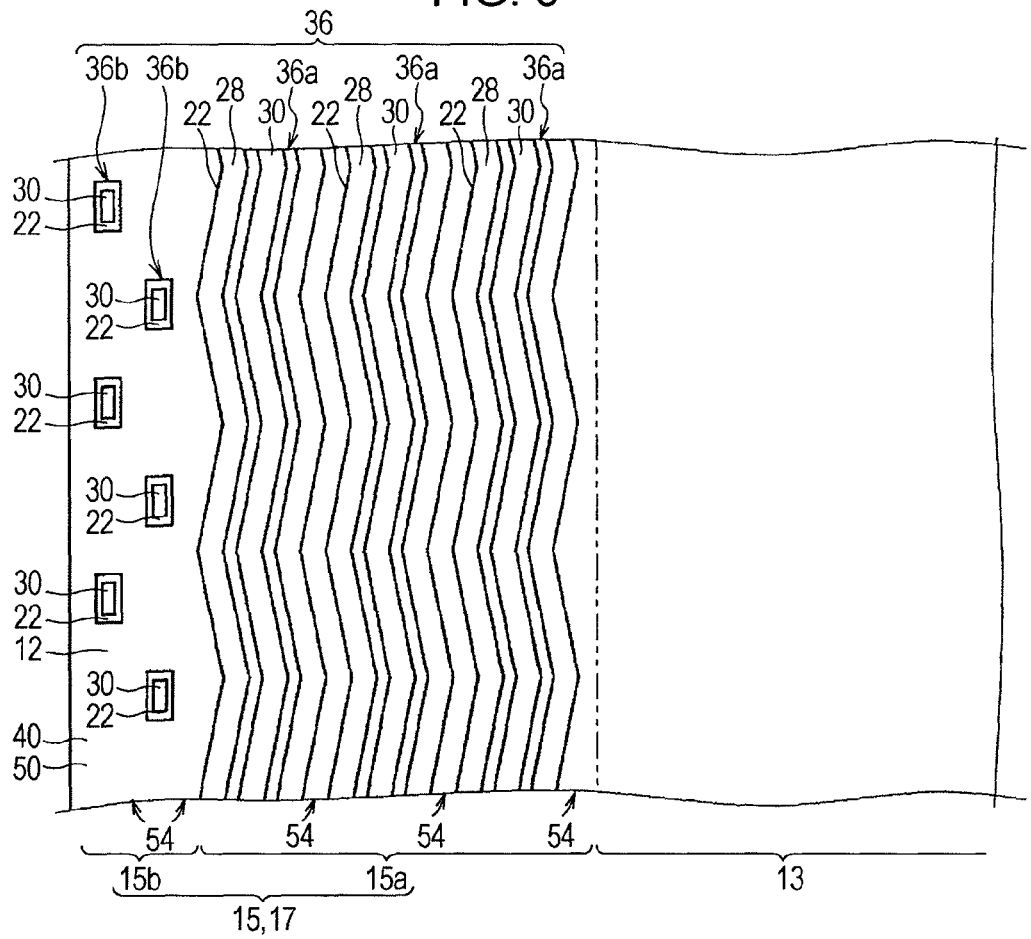
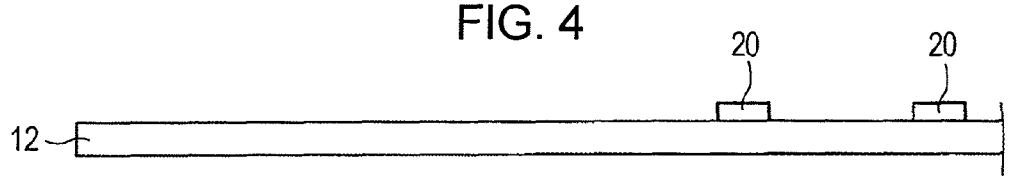
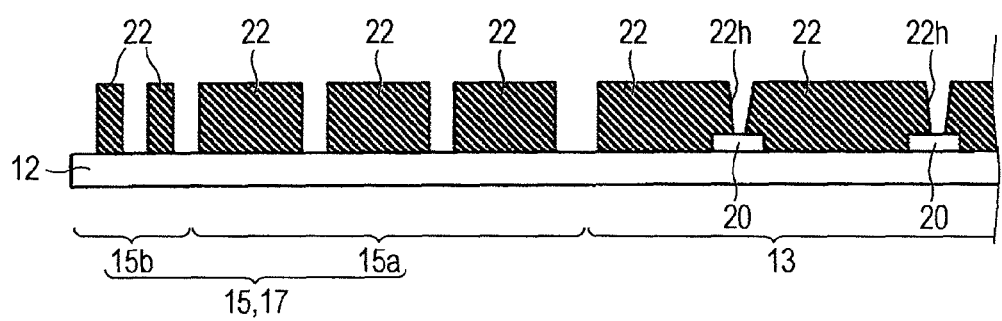

ORGANIC EL DEVICE AND METHOD FOR MANUFACTURING THE SAME

This application is a Continuation of copending application Ser. No. 12/514,567 filed on May 12, 2009, which is the U.S. National Phase of PCT/JP2007/073073, filed Nov. 29, 2007, and which claims priority to Application No. 2006-323492 filed in Japan, on Nov. 30, 2006. The entire contents of all of the above applications are hereby incorporated by reference.

TECHNICAL FIELD

The present invention relates to an EL (Electroluminescent) device such as an organic EL display or the like.

BACKGROUND ART

An organic EL device includes a plurality of pixel circuits, at least one first electrode, a plurality of organic EL elements, and at least one second electrode, which are formed on the same side of a first substrate.

An organic EL device uses a configuration in which a sealing glass substrate is bonded to said first substrate formed said organic EL elements in order to protect said organic EL elements from moisture and oxygen.

An organic EL device has a display region and a peripheral region around said display region. When said sealing glass substrate is bonded to said first substrate, a bonding configuration is utilized, in which an epoxy resin is applied to said peripheral region of a display region, or a transparent resin is applied over both of said display region and said peripheral region.

Examples of related art of the present invention include the techniques described in Patent Document 1 (Japanese Unexamined Patent Publication No. 2004-111119) and Patent Document 2 (Japanese Patent No. 3705190).

DISCLOSURE OF INVENTION

In a bonding configuration in which a transparent resin is applied over both of said display region and said peripheral region, it is required to fill substantially the whole area of the substrate with the resin in order to enhance product reliability. This is because if there is a void in the resin on said display region and said peripheral region, moisture and oxygen can easily enters the EL device through the void.

In order to solve the problem, an organic EL device according to a first embodiment of the present invention comprises a first substrate comprising a display region and a peripheral region, an organic EL display structure located in the display region of the first substrate, a second substrate, and a sealing layer in the space between said two substrates disposed to seal the organic EL display structures that covers both of said display region and said peripheral region and fixes said second substrate to said first substrate, wherein a dummy structure is located in the peripheral region so that the sealing layer in the peripheral region has substantially the same volume per unit area as that in the display region.

A method for manufacturing an organic EL device according to a second embodiment of the present invention comprises an act of forming an organic EL display structure in a display region of a first substrate comprising the display region and a peripheral region, an act of forming a dummy structure in the peripheral region of the first substrate so that the dummy structure in the peripheral region has substantially the same volume per unit area as the organic EL display structure in the display region, an act of applying a sealing material to a second substrate, and an act of bonding the second substrate to the first substrate with the sealing material so as to seal the organic EL display structure and the dummy structure and to fill the space between the first substrate and the second substrate with the sealing material.

An organic EL device according to a third embodiment of the present invention comprises a first substrate comprising a display region and a peripheral region, an organic EL display structure located in the display region of the first substrate, a sealing layer disposed to seal the organic EL display structure and cover the display region and the peripheral region of the first substrate, and a second substrate fixed to the first substrate with the sealing layer, wherein a dummy structure comprising at least one of the element structures of the organic EL display structure is located in the peripheral region, the space between the first and second substrates being filled with the sealing layer.

BRIEF DESCRIPTION OF DRAWINGS

FIG. 1 is a schematic plan view showing the whole configuration of an organic EL device according to an embodiment of the present invention.
FIG. 2 is a sectional view taken along line II-II of FIG. 1.
FIG. 3 is an enlarge schematic plan view of a principal portion shown in FIG. 1.
FIG. 4 is a drawing showing an act for manufacturing the organic EL device shown in FIG. 1.
FIG. 5 is a drawing showing an act for manufacturing the organic EL device shown in FIG. 1.

BEST MODE FOR CARRYING OUT THE INVENTION

Figure 6:
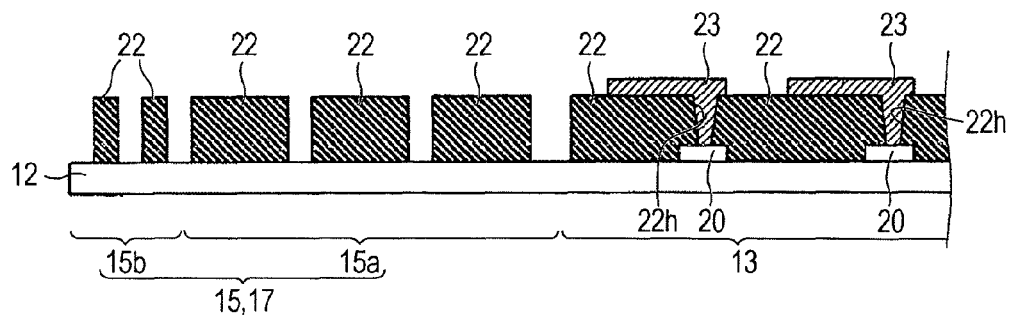
FIG. 6 is a drawing showing an act for manufacturing the organic EL device shown in FIG. 1.

An organic EL device and a method for manufacturing the same according to an embodiment of the present invention are descried below.
<Configuration of Organic EL Device>
An organic EL device 10 includes a first substrate 12, an organic EL display structure 18, a dummy structure 36, a sealing layer 40, and a second substrate 50. The organic EL device 10 uses a top emission-type structure in which light emitted from an organic EL element 24 included in the organic EL display structure 18 is emitted to outside through the sealing layer 40 and the second substrate 50 which are disposed in an upper portion. Although, in this embodiment, the organic EL device 10 is described on the assumption that it uses an active matrix driving system, a passive matrix driving system may be used.

The first substrate 12 is a glass substrate or the like and has a substantially rectangular plate shape. The first substrate 12 includes a display region 13, a peripheral region 15, and an external pads region 16. More specifically, the substantially rectangular display region 13 is disposed substantially at the center of the first substrate 12, and the peripheral region 15 is disposed to surround the display region 13. In addition, the external pads region 16 is disposed in the two side portions which hold a predetermined corner of the first substrate 12 therebetween (in FIG. 1, the right side portion and the bottom side portion which hold the lower right corner therebetween). The organic EL display structure 18 is formed in the display region 13 and the dummy structure 36 is formed in the peripheral region 15. The display region 13 is a region where the organic EL display structure 18 including the organic EL element 24 which emits light is formed. The peripheral region 15 is a region where the dummy structure 36 which does not emit light is formed.

The organic EL display structure 18 is formed in the display region 13 of the first substrate 12 and is a structural portion for emission display in the organic EL device 10. The organic EL display structure 18 includes as element structures a circuit layer 20, a first insulating layer 22 (planarization layer), the organic EL element 24, a second insulating layer 28 (interlayer insulating layer), and a spacer portion 30. The display region 13 of the first substrate 12 is partitioned into a plurality of pixels forming regions arranged in a matrix including a plurality of rows and a plurality of columns. The organic EL element 24 is formed in each of the pixel forming regions. The spacer portion 30 is formed in a lattice shape so as to partition the respective pixel forming regions.

The circuit layer 20 is formed on the first substrate 12 and constitutes a thin film transistor and a part of a capacitor element corresponding to each pixel. Further, a wiring portion (not shown) connected to each circuit layer 20 is formed on the first substrate 12. In addition, a protective layer (not shown) is formed on the first substrate 12 on which the circuit layers 20 are formed.

The first insulating layer 22 is provided on the first substrate 12 so as to cover the circuit layers 20. The first insulating layer 22 has the function to planarize the first substrate 12 on the upper surface of which the circuit layers 20 are formed and to insulate the organic EL elements 24 from the first substrate 12. The first insulating layer 22 is made of an inorganic material such as silicon oxide, silicon nitride, or the like, or an insulating resin. The first insulating layer 22 may have either a single-layer structure or a multilayer structure. When the first insulating layer 22 has a multilayer structure, a portion of the layers may be used as a constituent of the dummy structure 36.

In addition, in the first insulating layer 22, contact holes 22h are formed for connecting first electrode layers 23, which will be described below, to the circuit layers 20.

The organic EL elements 24 are formed on the first insulating layer 22 and each include the first electrode layer 23, an organic layer 25, and a second electrode layer 26.

The first electrode layers 23 are formed on the first insulating layer 22 and constitute lower electrodes of the organic EL elements 24. The first electrode layers 23 are electrically connected to the circuit layers 20 through the contact holes 22h.

In addition, the second insulating layer 28 made of a resin or the like is formed on the first insulating layer 22 and the first electrode layers 23. The second insulating layer 28 has apertures 28h corresponding to the respective pixels, and the organic layer 25 and the second electrode layer 26 are formed in each of the apertures 28h.

The organic layer 25 includes a light-emitting layer containing an organic material as an illuminant. The organic layer 25 is disposed to adhere to the first electrode layer 23 so as to make surface contact with the first electrode layer 23 in each of the apertures 28h. The outer periphery of the organic layer 25 overlaps the periphery of each aperture 28h in the second insulating layer 28, causing a state of non-contact with the first electrode layer 23. Therefore, a portion of the organic layer 25 which overlaps the second insulating layer 28 and is in non-contact with the first electrode layer 23 does not emit light. Namely, the second insulating layer 28 defines the emission regions of the organic EL elements 24.

The organic layer 25 may have either a single layer structure or a multilayer structure including laminated layers having different functions. When the organic layer 25 has a multilayer structure, it may contain a portion made of an inorganic material, and the organic layer 25 may thus have such a structure with an inorganic material.

The second electrode layer 26 is formed on the organic layer 25 using a conductive material with light transmissivity, such as indium tin oxide (ITO), tin oxide, or the like, so that light is emitted from the upper surface side of the organic layer 25. Even if the second electrode layer 26 is made of a material which little transmits light, such as magnesium, silver, aluminum, or the like, the formation of a thin layer having a thickness of 100 nm or less can impart light transmissivity to the second electrode layer 26 while securing conductivity to some extent.

The spacer portion 30 is formed in a lattice shape using an insulating resin. The spacer portion 30 has the function to separate between the second electrode layers 26 and the function to mount and support a metal mask when the organic layers 25 are formed by evaporation. When attention is paid to the function to separate between the second electrode layers 26, the spacer portion 30 may be referred to as a separator. Therefore, in order to separate between the second electrode layers 26, the spacer portion 30 may be formed in a trapezoidal shape in which the top of the spacer portion 30 is wider than the bottom thereof. Of course, the spacer portion 30 may have only the function to mount and support a metal mask. The spacer portion 30 is provided according to demand and may be omitted.

In addition, a protective layer (not shown) is formed on the surface of the organic EL display structure 18.

The peripheral region 15 of the first substrate 12 includes a peripheral filled region 17. In this embodiment, substantially the whole of the peripheral region is the peripheral filled region 17. In other words, the peripheral filled region 17 is formed to substantially surround the display region 13, which means not only the case in which the peripheral filled region 17 surrounds the display region 13 with no space but also the case in which the peripheral filled region 17 surrounds the display region 13 with one or more spaces. This applies to the case in which a linear dummy structure 36a and a peripheral seal portion substantially surround the display region 13. The dummy structure 36 is formed in the peripheral filled region 17.

As described in detail below, the dummy structure 36 has the function to control the volume per unit area of the sealing layer 40 in the peripheral filled region 17 so that the volume per unit area is substantially the same as the volume per unit area of the sealing layer 40 in the display region 13. The dummy structure 36 is composed of at least one of the element structures of the organic EL display structure 18. In other words, a material constituting the dummy structure 36 contains at least one of the materials of the organic EL display structure 18.

In this embodiment, the dummy structure 36 includes two types of structures, i.e. linear dummy structures 36a provided on the inner peripheral side of the peripheral filled region 17 and dot-like dummy structures 36b provided on the outer peripheral side of the peripheral filled region 17.

The linear dummy structures 36a each include, as the constituent structures, the first insulating layer 22, the second insulating layer 28, and the spacer portion 30. Namely, when the organic EL display structure 18 is formed, the first insulating layer 22, the second insulating layer 28, and the spacer portion 30 are formed also in the peripheral filled region 17, thereby forming the linear dummy structures 36a.

In addition, the first insulating layer 22, the second insulating layer 28, and the spacer portion 30 which constitute the linear dummy structures 36a are formed on the inner side of the peripheral filled region 17 in a zigzag shape alternately bending inward and outward and they substantially surround the display region 13.

The dot-like dummy structures 36b each include, as the constituent structures, the first insulating layer 22 and the spacer portion 30. Namely, when the organic EL display structure is formed, the first insulating layer 22 and the spacer portion 30 are laminated also in the peripheral filled region 17, thereby forming the dot-like dummy structures 36b.

In addition, the first insulating layer 22 and the spacer portion 30 which constitute the dot-like dummy structures 36b are formed on the outer side of the peripheral filled region 17 so as to be scattered at a plurality of positions and to surround the display region 13. More specifically, the dot-like dummy structures 36b are formed at a predetermined pitch along a plurality (here, two) of lines on the outer peripheral side of the peripheral filled region 17 so that the dot-like dummy structures 36b along one of the lines are deviated from those along the other line by half pitch.

The sealing layer 40 is made of a transparent resin or the like and charged in a space between the second substrate 50 or the organic EL display structure 18 and the dummy structure 36 on the first substrate 12. Therefore, the sealing layer 40 is disposed to seal the organic EL display structure 18 and the dummy structure 36 and to cover the display region 13 and the peripheral filled region 17 of the first substrate 12.

The second substrate 50 is made of a transparent substrate such as a glass substrate or the like and is formed in a shape corresponding to the display region 13 and the peripheral region 15. The second substrate 50 is fixed to the first substrate 12 through the sealing layer 40. A main surface of the second substrate 50 on which the sealing layer 40 is formed is formed in a substantially flat surface. Being substantially flat means not only the case where the surface is strictly completely flat but also the case where the maximum difference of elevation of irregularity formed on the second substrate 50 is 3 μm or less. Therefore, when the first substrate 12 and the second substrate 50 are bonded together, a sealing material flows along a main surface of the second substrate 50 and easily flows into recess portions, and thus the space between the first substrate 12 and the second substrate 50 can be sufficiently filled with the sealing material.

In addition, in the organic EL device 10, when the dummy structure 36 is formed, the areal ratio of the dummy structure 36 on the first substrate 12, the configuration (height and the like) of the dummy structure 36, or the like is controlled so that the volume per unit area of the sealing layer 40 in the display region 13 is substantially the same as the volume per unit area of the sealing layer 40 in the peripheral filled region 17. Namely, consideration is made on the basis of the organic EL display structure 18 and the dummy structure 36, the dummy structure 36 is formed on the first substrate 12 so that the volume per unit area of the organic EL display structure 18 in the display region 13 is substantially the same as the volume per unit area of the dummy structure 36 in the peripheral filled region 17. The unit area as a reference is, for example, 1 mm².

Here, the expression that the volume per unit area of the sealing layer 40 in the display region 13 is substantially the same as the volume per unit area of the sealing layer 40 in the peripheral filled region 17 means the following: the second substrate 50 on which the sealing material is substantially uniformly applied is superposed on the first substrate 12, and both in the display region 13 and in the peripheral filled region 17, the space between the first substrate 12 and the second substrate 50 is able to be fully filled with the sealing material.

Therefore, the expression that the volume per unit area of the sealing layer 40 in the display region 13 is substantially the same as the volume per unit area of the sealing layer 40 in the peripheral filled region 17 means not only the case where both volumes per unit area are strictly the same but also the case where both volumes per unit area are within a predetermined allowable range.

As a result of an experiment, the inventor of the present invention found that when the ratio ((volume per unit area of the sealing layer 40 in the peripheral filled region 17)/(volume per unit area of the sealing layer 40 in the display region 13)) is 0.81 to 1.09, the peripheral filled region 17 is able to be fully filled with the sealing layer 40, while when the volume per unit area ratio is 1.18 to 1.20, there occurs a space that cannot be fully filled with the sealing layer 40 in the peripheral filled region 17. Namely, when the volume per unit area ratio is in the range of 0.81 to 1.09, both the display region 13 and the peripheral filled region 17 can be sufficiently filled with the sealing layer 40.

Therefore, the expression that the volume per unit area of the sealing layer 40 in the display region 13 is substantially the same as the volume per unit area of the sealing layer 40 in the peripheral filled region 17 includes the case where the ratio of the volume per unit area of the sealing layer 40 in the peripheral filled region 17 to the volume per unit area of the sealing layer 40 in the display region 13 is 0.81 to 1.09.

Therefore, the volume per unit area of the sealing layer 40 in the peripheral filled region 17 may be changed within the above range as described below.

The peripheral region 15 includes a first peripheral region 15a and a second peripheral region 15b more apart from the display region 13 than the first peripheral region 15a. In the peripheral region 15, the inner side on which the linear dummy structures 36a are formed corresponds to the first peripheral region 15a. The outer side on which the dot-like dummy structures 36b are formed corresponds to the second peripheral region 15b.

The volume per unit area which can be filled with the sealing layer 40 in the second peripheral region 15b is larger than the volume per unit area which can be filled with the sealing layer 40 in the first peripheral region 15a. Namely, when consideration is made on the basis of the dummy structure 36, on the first substrate 12, the volume per unit area of the dot-like dummy structures 36b in the second peripheral region 15b is smaller than the volume per unit area of the linear dummy structures 36a in the first peripheral region 15a. In this embodiment, the linear dummy structures 36a are formed in the first peripheral region 15a, and the dot-like dummy structures 36b are formed in the second peripheral region 15b. Thus, the volume per unit area to be filled in the second peripheral region 15b is larger than the volume per unit area to be filled in the first peripheral region 15a.

Therefore, when the second substrate 50 to which the sealing material is substantially uniformly applied is bonded to the first substrate 12, the first peripheral region 15a having a smaller volume per unit area to be filled than that of the second peripheral region 15b is more securely filled with the sealing material. In the second peripheral region 15b having a larger volume per unit area to be filled than that of the first peripheral region 15a, the space between the first substrate 12 and the second substrate 50 is more securely filled with the sealing material applied to the second substrate 50, with causing little protrusion of the sealing material in the side direction.

Both the first peripheral region 15a and the second peripheral region 15b don't have to be present in the peripheral filled region 17. For example, only the first peripheral region 15a may be present in the peripheral filled region 17 and the condition in which the sealing layer volume per unit area in the first peripheral region 15a is substantially the same as in the display region 13 may be satisfied. Further, the second peripheral region 15b may be outside of the peripheral filled region 17 and the condition in which the sealing layer volume per unit area in the second peripheral region 15b is substantially the same as in the display region 13 may not be satisfied. In this case, the second peripheral region 15b may not be fully filled with the sealing material. Of course, such a structure may be used. In consideration of such a case, the volume per unit area to be filled means the volume per unit area between the dummy structure 36 on the first substrate 12 and the second substrate 50, which can be filled with the sealing material.

From another viewpoint, the dummy structures 36a and 36b are formed so that the volume per unit area of the sealing layer 40 in the peripheral region 15 is substantially the same as the volume per unit area of the sealing layer 40 in the display region 13, and the space between the first substrate 12 and the second substrate 50 is filled with the sealing layer 40. In this case, the above-mentioned condition doesn't have to be satisfied by forming the dummy structures 36a and 36b over the whole of the peripheral region 15, and the above-mentioned condition may be satisfied by forming the dummy structures 36a and 36b in a portion of the peripheral region 15. This applies to the volume per unit area ratio and the like which will be described below.

The second peripheral region 15b is preferably set in a region of 0.5 mm or less from the edge of the organic EL device 10. When a glass plate is divided to produce a plurality of organic EL devices 10, it is effective to set the second peripheral region 15b inside of a division line. When the second peripheral region 15b is formed inside of a division line, it is possible to effectively reduce the occurrence of division defects due to protrusion of the sealing material from the division line, thereby reducing deterioration of the manufacture yield.

In the organic EL device 10, peripheral sealing portions 54 are formed around the display region 13, the sealing layer 40 being in direct contact with the first substrate 12 in the peripheral sealing portions 54. In this embodiment, the peripheral sealing portions 54 are formed in a substantially rectangular frame shape between the display region 13 and the innermost linear dummy structure 36a, between the linear dummy structures 36a, between the outermost linear dummy structure 36a and the dot-like dummy structures 36b along the innermost line, and between the respective lines along which the dot-like dummy structures 36b are formed. The peripheral sealing portions 54 preferably substantially surround the display region.

In each of the peripheral sealing portions 54, the element structures constituting the organic EL display structure 18 are not formed, and the sealing layer 40 is in direct contact with the first substrate 12. In addition, a protective layer or the like composed of an inorganic material, such as silicon nitride, silicon oxynitride, silicon oxide, or the like, may be formed on the first substrate 12. Namely, the expression "the sealing layer 40 is in direct contact with the first substrate 12" represents the case where both are in contact without the basic element structures constituting the organic EL display structure 18 therebetween and includes the case where a protective layer or the like which does not substantially adversely affect entering and diffusion of moisture or oxygen is interposed between the sealing layer 40 and the first substrate 12.

Further, each of the circuit layers 20, the first electrode layers 23, and the second electrode layers 26 is connected to line (not shown). The line is appropriately extended to the external pads region 16 and connected to an outside driver circuit or the like in the external pads region 16. The driver circuit or the like may be formed in the external pads region 16.

<Method for Manufacturing Organic EL Device>

The method for manufacturing the organic EL device 10 is described below. Although detailed steps are described, the organic EL device 10 and the manufacturing method therefor are not limited to these steps.

First, the organic EL display structure 18 is formed on the display region 13 of the first substrate 12. At the same time, the dummy structure 36 is formed on the peripheral region 15 of the first substrate 12.

More specifically, as shown in FIG. 4, the circuit layer 20 is formed as a backplane circuit for deriving each of the organic EL elements 24 on the first substrate 12, such as a glass substrate or the like. The circuit layers 20 are formed by forming an element group including bottom-gate back channel etch-type TFTs using amorphous silicon. A bottom-gate back channel etch-type TFT circuit has a six-layer structure including a gate electrode, a silicon nitride layer, hydrogenated amorphous silicon, N-type amorphous silicon for contact, a drain/source electrode, and a silicon nitride passivation layer. Then, a protective layer such as an inorganic passivation layer or the like is formed on the first substrate 12 on which the circuit layers 20 are formed.

Then, as shown in FIG. 5, in order to planarize the first substrate 12, a photosensitive resin is applied over the entire region of the first substrate 12. Then, the photosensitive resin is removed from only portions corresponding to the contact holes 22h by exposure and development. As a result, the first insulating layer 22 constituting the organic EL display structure 18 and the dummy structure 36 in the display region 13 and the peripheral region 15, respectively, is formed. As the photosensitive resin, positive acrylic resin is applied to a thickness of 4 exposed to UV light, and then developed with TMAH (tetramethylammonium hydroxide). In the exposure and development step, the first insulating layer 22 is removed from the contact holes 22h, a portion not containing the first insulating layer 22 in the peripheral region 15, the external pads region 16, and the like. The acrylic resin is fired in a convection oven at 230° C. for 30 minutes. Consequently, underlying TFTs can be planarized, and disconnection and electrode short-circuiting due to the steps formed by the circuits of the organic EL display structure 18 can be reduced. As the first insulating layer 22, instead of the acrylic resin, a siloxane polymer, a silicon nitride layer, or the like may be used.

The first insulating layer 22 covers the whole of the display region 13 excluding the contact holes 22h in order to planarize the circuits in the display region 13. On the other hand, in the peripheral region 15, as described above, the first insulating layer 22 is appropriately removed in a predetermined pattern in order to control the volume per unit area of the sealing layer 40 in the peripheral region 15.

Next, as shown in FIG. 6, the first electrode layers 23 are formed. In this step, AlNd is deposited by sputtering over the entire surface of the substrate under the manufacturing process and patterned by a photolithography process. As a photoresist, a positive novolac resin is used, exposed to UV light, and developed with THAM. AlNd is patterned by wet etching with a mixed solution of phosphoric acid, nitric acid, and acetic acid, and then removing the resist. As a first electrode, Al, an Al alloy (containing Nd, Ni, Y, Gd, or Pd), Ag, an Ag alloy (containing Pd or Cu), Mo, or the like can be used.

Figure 7:
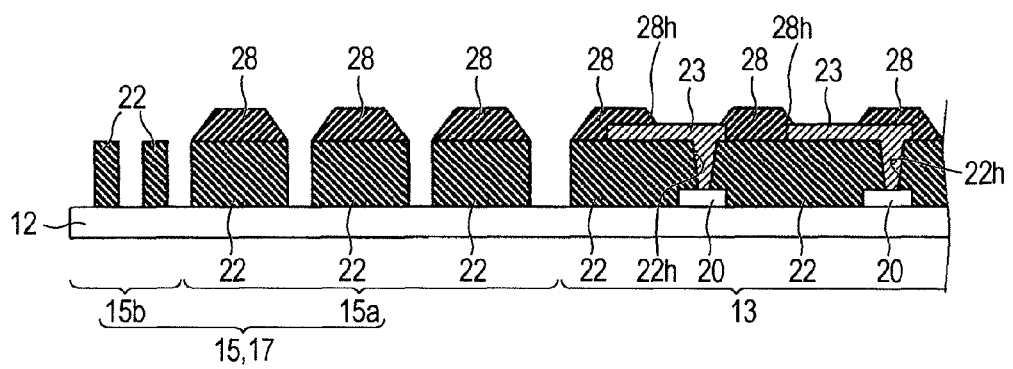
FIG. 7 is a drawing showing an act for manufacturing the organic EL device shown in FIG. 1.

Next, as shown in FIG. 7, the second insulating layer 28 is formed. The same photosensitive resin as that used for forming the first insulating layer 22 is applied to a thickness of 1.5 µm on the substrate under the manufacture, exposed to UV light, and then developed with TMAH. The resin is fired in a convection oven at 230° C. for 30 minutes. As the second insulating layer 28, like the first insulating layer 22, a siloxane polymer, a silicon nitride layer, or the like may be used instead of the photosensitive resin.

The second insulating layer 28 is provided for insulating a portion other than the light-emitting portion of the organic layer 25, where the first electrode layer 23 and the second electrode layer 26 overlap each other. In the display region 13, the second insulating layer 28 is removed from the light-emitting portion of the organic layer 25. In a configuration of the organic EL display structure, if required, the second insulating layer 28 is removed from a contact hole for connecting the second electrode layer 26 to lower line.

On the other hand, in the peripheral region 15, as described above, the second insulating layer 28 is appropriately removed in a predetermined pattern in order to control the volume per unit area of the sealing layer 40 in the peripheral region 15.

Figure 8:
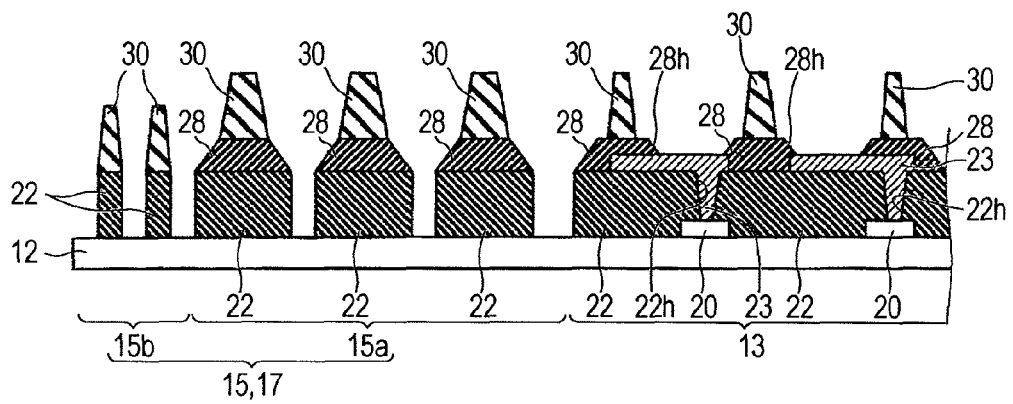
FIG. 8 is a drawing showing an act for manufacturing the organic EL device shown in FIG. 1.

Then, as shown in FIG. 8, the spacer portions 30 are provided. The spacer portions 30 are adapted for reducing damage to the organic layers 25 due to contact with a metal mask when the organic layers 25 are formed by evaporation using the metal mask. During evaporation, the metal mask is mounted and supported on the spacer portions 30 apart from the organic layers 25.

As a material of the spacer portions 30, a negative acrylic resin having a dissolution rate in a developer which is decreased by light irradiation, a siloxane polymer, or a negative novolac resin, or the like can be used.

A negative novolac resin is used as the material of the spacer portions 30, and then patterned to form the spacer portions 30 having a trapezoidal shape in which the top is wider than the bottom. The spacer portions 30 are formed in a lattice pattern to surround the organic EL elements 24, and thus pixel separation can be realized by the trapezoidal spacer portions 30 without patterning of the second electrode layer 26.

If the spacer portions 30 are provided with only the function to support the metal mask, of course, the area required for forming the spacer portions 30 can be decreased.

As described above, in the display region 13, the spacer portions 30 are formed in a lattice shape on the second insulating layer 28. On the other hand, in the peripheral region 15, as described above, the spacer portions 30 are appropriately removed in a predetermined pattern in order to control the volume per unit area of the sealing layer 40 in the peripheral region 15.

Then, the substrate under manufacture is annealed under a temperature condition of 230° C. The annealing may be performed in a nitrogen atmosphere or an air atmosphere.

Next, the annealed substrate is washed before evaporation. The washing is performed with, for example, water or functional water such as ozone water or the like. In addition to the washing with functional water, treatment with UV, ozone, or the like may be performed for removing organic substances on the first electrode layers 23.

Figure 9:
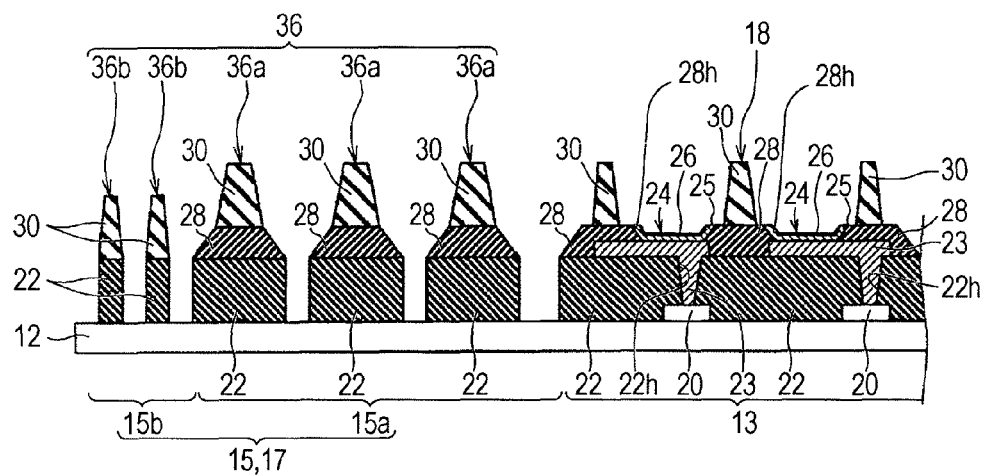
FIG. 9 is a drawing showing an act for manufacturing the organic EL device shown in FIG. 1.

Next, the washed substrate is baked in vacuum to remove moisture remaining after the washing, and as shown in FIG. 9, the organic layers 25 and the second electrode layers 26 are formed. In this step, the organic layers 25 and the second electrode layers 26 are formed in the display region 13 and not formed in the peripheral region 15. The organic layers 25 and the second electrode layers 26 can be formed any one of various techniques including known techniques.

Through the above steps, the organic EL display structure 18 and the dummy structure 36 are formed on the first substrate 12. In other words, the dummy structure 36 is formed in the same steps as those for forming the organic EL display structure 18 on the first substrate 12.

After the second electrode layers 26 are formed, a silicon nitride layer is formed to a thickness of 3 µm by CVD to form a protective layer of the organic EL elements 24. More specifically, the protective layer can be deposited by capacitive coupled plasma CVD using silane and ammonia or nitrogen.

Figure 10:
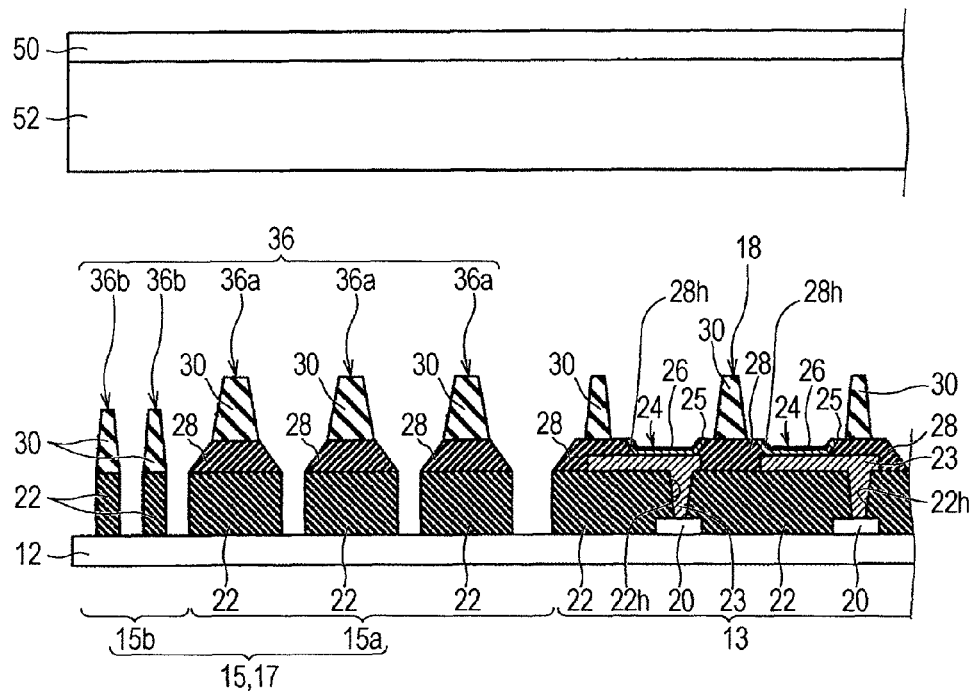
FIG. 10 is a drawing showing an act for manufacturing the organic EL device shown in FIG. 1.

On the other hand, as shown in FIG. 10, a sealing material is applied in a substantially uniform thickness to a main surface of the second substrate 50.

The second substrate 50 may be made of plain glass without a pattern or glass provided with a black matrix made of a Cr laminated layer or provided with a color filter. In this embodiment, plain glass on which only a process mark is formed without a pattern being formed in a display portion is used. As the sealing material 52, a UV-curable epoxy resin, a thermosetting resin, or the like can be used. Herein, a UV-curable epoxy resin is used.

The sealing material 52 is applied to a main surface of the second substrate 50 by screen printing. The thickness of the sealing material 52 is determined so that the sealing material is flat after printing, and irregularity formed by the organic EL display structure 18 on the first substrate 12 can be sufficiently offset. For example, when a difference of elevation in irregularity in the emission portion on the first substrate 12 is 5 µm, printing may be performed so that the thickness of the sealing material 52 after coating is 7 µm. When the second substrate 50 has irregularity, for example, when a color filter is formed on the second substrate 50, the sealing material 52 may be applied thickly. When the first substrate 12 has small irregularity, for example, when the spacer portions 30 are not formed on the first substrate 12, a thickness of about 3 µm is sufficient for the sealing material 52 after coating. Namely, the thickness of the sealing material 52 is appropriately controlled to a thickness which permits filling in irregularity according to irregularity on the first substrate 12 and irregularity on the second substrate 50.

Then, the second substrate 50 is fixed to the first substrate 12 through the sealing material 52 so as to seal the organic EL display structure 18 and the dummy structure 36.

More specifically, the first substrate 12 on which the organic EL display structure 18 and the dummy structure 36 are formed and the second substrate 50 on which the sealing material 52 is applied are bonded together in a nitrogen atmosphere. When the sealing material 52 is a resin which is cured immediately after UV irradiation, the sealing material 52 may be irradiated with UV after both substrates are bonded together. When the sealing material 52 is a resin which requires a time up to curing after UV irradiation, the sealing material 52 may be irradiated with UV before both substrates are bonded together. In this case, there is a merit that damage to the organic layers due to UV light can be reduced. As a result, the space between the first substrate 12 and the second substrate 50 is filled with the sealing material 52.

When a thermosetting resin is used as the sealing material 52, temporary firing may be performed after both substrates are bonded together or both substrates are partially temporarily fixed using a UV curable resin in a portion.

After the first substrate 12 and the second substrate 50 are bonded together, the substrates are fired in a convection oven at 80° C. for 30 minutes to finally cure the sealing material 52. As a result, the organic EL device 10 is manufactured.

Figure 11:
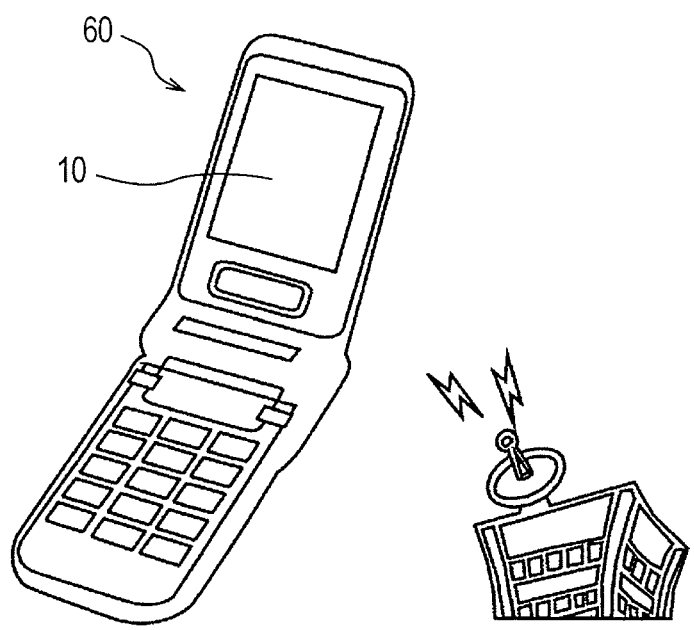
FIG. 11 is a drawing showing an application example of the organic EL device shown in FIG. 1.

The organic EL device 10 manufactured as described above is incorporated as a display panel of a cellular phone 60, for example, as shown in FIG. 11. The organic EL device 10 is also incorporated as a display panel of a personal information terminal device (PDA), a notebook computer, or the like or used as a display device of a desktop computer, a television, or the like.

In the organic EL device 10 configured as described above, the peripheral region 15 has the peripheral filled region 17 in which the dummy structure 36 is formed so that the volume per unit area of the sealing layer 40 in the peripheral region 15 is substantially the same as the volume per unit area of the sealing layer 40 in the display region 13. Therefore, the sealing material can be charged in both the display region 13 and the peripheral filled region in substantially the same volume per unit area. Thus, when the second substrate 50 to which the sealing material 52 is applied is bonded to the first substrate 12, both the display region 13 and the peripheral filled region 17 of the peripheral region 15 can be filled with the sealing material 52 in proper amounts with as a small space as possible.

As described above, when both the display region 13 and the peripheral region 15 are filled with the sealing material 52 without a space, it is possible to reduce moisture and oxygen entering the display region 13 through the peripheral filled region 17. Therefore, deterioration of the organic layers 25 and the like can be reduced, and thus the organic EL device 10 having excellent reliability can be manufacture.

Since the dummy structure 36 is configured by one of the element structures constituting the organic EL display structure 18 or a combination or two or more of the element structures, the dummy structure 36 can be formed at the same step as the formation of the organic EL display structure 18. Therefore, the above-described configuration can be easily realized.

In this embodiment, description is made of the case where the substantially rectangular frame-shaped peripheral region 15 is formed to surround the display region 13, and the whole of the peripheral region 15 is the peripheral filled region 17. However, a portion of the peripheral region 15 in the circumferential direction or the width direction may be the peripheral filled region 17. That is, the peripheral region 15 may have the peripheral filled region 17 in at least a portion thereof. Therefore, in the other portion of the peripheral region 15, the dummy structure 36 may not be formed at all, i.e., the conditions for the peripheral filled region 17 may not be satisfied.

Of course, when the peripheral filled region 17 is formed to substantially surround the display region 13, entering of moisture or oxygen in the display region 13 can be securely reduced by the sealing layer 40 which fills the peripheral filled region 17.

In addition, the linear dummy structures 36a are formed in a linear shape having a zigzag shape, and the dot-like dummy structures 36b are provided to be scattered at a plurality of positions. Therefore, the bonding area between the sealing layer 40 and the dummy structure 36 on the first substrate 12 can be increased, thereby enhancing the adhesive strength of the first substrate 12.

Further, since the linear dummy structures 36a are formed to in a zigzag shape and they substantially surround the display region 13, the adhesive strength of the first substrate 12 through the sealing layer 40 can be enhanced. Further, since the linear dummy structures 36a are formed continuously and uniformly along a direction in which the display region 13 is surrounded, entering of moisture or oxygen in the display region 13 can be securely reduced.

The lower element structures constituting the dummy structure 36 may be formed to extend over the whole or extend in a plane in the peripheral filled region 17, and only the upper element structures constituting the dummy structure 36 may be formed in a zigzag shape or a dot shape.

The first insulating layer 22, the second insulating layer 28, and the spacer portion 30 which constitute the organic EL display structure 18 are generally formed to be thicker than the other element structures. Therefore, by using the first insulating layer 22, the second insulating layer 28, and the spacer portion 30, preferably using only the first insulating layer 22, the second insulating layer 28, and the spacer portion 30, the dummy structure 30 can be relatively easily formed, so as to satisfy the above-mentioned condition.

The dummy structure 36 may be formed using the first insulating layer 22 and the second insulating layer 28, more preferably using only the first insulating layer 22 and the second insulating layer 28. Since the first insulating layer 22 and the second insulating layer 28 are relatively thick, the dummy structure 36 can be relatively easily formed to satisfy the condition. That is, the dummy structure 36 is preferably formed to include at least one of the materials of the spacer portion 30, the first insulating layer 22, and the second insulating layer 28.

Of course, the dummy structure 36 may include the circuit layers 20, the first electrode layers 23, or the second electrode layer 26 other than the above element structures. The dummy structure 36 preferably does not include a portion made of an organic material, such as the organic layers 25 and the like. Therefore, it can be expected to obtain the effect of more securely reducing entering and diffusion of moisture or oxygen.

Further, the peripheral filled region 17 includes the first peripheral region 15a and the second peripheral region 15b more apart from the display region 13 than the first peripheral region 15a in the outward direction. In addition, the volume per unit area to be filled with the sealing layer 40 in the second peripheral region 15b is set to be larger than that in the first peripheral region 15a. Therefore, the first peripheral region 15a having a smaller volume per unit area to be filled is more securely filled with the sealing material. Further, in the second peripheral region 15b, the space between the first substrate 12 and the second substrate 50 is more securely filled with the sealing material applied to the second substrate 50, thereby causing little protrusion of the sealing material in the side direction. That is, in the display region 13, it is possible to reduce protrusion (outward flow) of the sealing material in the side direction while maintaining secure sealing properties.

Since the peripheral sealing portions 54 in which the sealing layer 40 is substantially in contact with the first substrate 12 are formed around the display region 13, entering of moisture or oxygen can be sufficiently reduced by the peripheral sealing portions 54.

The invention claimed is:
1. An organic EL device comprising:
a first substrate comprising a display region and a peripheral region;

an organic EL display structure located in the display region of the first substrate;

a sealing layer disposed to seal the organic EL display structure and cover the display region and the peripheral region of the first substrate;

a second substrate fixed to the first substrate through the sealing layer; and a dummy structure located in the peripheral region, wherein the dummy structure has a scattered shape and a linear shape, wherein the volume per unit area to be filled with the sealing layer in the peripheral region corresponding to the scattered shape is larger than the volume per unit area to be filled with the sealing layer in the peripheral region corresponding to the linear shape.

2. The organic EL device according to claim 1, wherein the linear shape surrounds the display region and the scattered shape is located closer to an edge of the first substrate than the linear shape.

3. The organic EL device according to claim 1, wherein the element structures of the dummy structure contains at least one of the layers of the organic EL display structure.

4. The organic EL device according to claim 1, wherein the dummy structure is located in the peripheral region so that the volume per unit area of the sealing layer of 1 mm$^2$ is substantially the same as the volume per unit area of the sealing layer of 1 mm$^2$ in the display region.

5. The organic EL device according to claim 1, wherein the ratio of the volume per unit area of the sealing layer in the peripheral region to the volume per unit area of the sealing layer in the display region is in a range of 0.81 to 1.09.

6. The organic EL device according to claim 1, wherein the organic EL display structure comprises:

a circuit layer located on the first substrate;

a first insulating layer located on the first substrate to cover the circuit layer;

an organic EL element located on the first insulating layer;

a second insulating layer located on the first insulating layer to define an emission region of the organic EL element; and a spacer portion located on the second insulating layer.

7. The organic EL device according to claim 6, wherein a constituent material of the dummy structure contains at least one of the constituent material of the first insulating layer, the constituent material of the second insulating layer, and the constituent material of the spacer portion.

8. The organic EL device according to claim 1, wherein a peripheral sealing portion is located around the display region, the first substrate being in direct contact with the sealing layer in the peripheral sealing portion.

9. The organic EL device according to claim 1, wherein the linear shape has a plurality of bent portions.

10. The organic EL device according to claim 1, wherein the linear shape is formed in a zigzag shape to bend inward and outward to the display region.

\* \* \* \* \*